United States Patent [19]

Harada et al.

[11] Patent Number: 5,163,209
[45] Date of Patent: Nov. 17, 1992

[54] METHOD OF MANUFACTURING A STACK-TYPE PIEZOELECTRIC ELEMENT

[75] Inventors: Takeshi Harada, Toride; Masatoshi Kanamaru; Akiomi Kohno, both of Ibaraki; Shigeru Jomura, Tokyo, all of Japan

[73] Assignees: Hitachi, Ltd.; Hitachi Metals, Ltd., both of Tokyo, Japan

[21] Appl. No.: 510,875

[22] Filed: Apr. 18, 1990

[30] Foreign Application Priority Data

Apr. 26, 1989 [JP] Japan ................................ 1-104464
Jul. 10, 1989 [JP] Japan ................................ 1-177829
Dec. 13, 1989 [JP] Japan ................................ 1-323388

[51] Int. Cl.⁵ ............................................. H04R 17/00
[52] U.S. Cl. ................................... 29/25.35; 310/328
[58] Field of Search ............... 29/25.35; 310/328, 365, 310/366, 368

[56] References Cited

U.S. PATENT DOCUMENTS 3,635,016  1/1972  Benson .
4,472,652  9/1984  Brice et al. ........................ 29/25.35
4,978,881  12/1990  Wakita et al. ..................... 310/366

FOREIGN PATENT DOCUMENTS 113999   7/1984  European Pat. Off. .
350941   1/1990  European Pat. Off. .
59-32040 8/1984  Japan .
61-27688 2/1986  Japan .
62-62571 3/1987  Japan .
63-17354 4/1988  Japan .

OTHER PUBLICATIONS

Sensor Technique vol. 3, No. 12, 119837 pp. 32–33.

Primary Examiner—P. W. Echols
Attorney, Agent, or Firm—Antonelli, Terry, Stout & Kraus

[57] ABSTRACT

In an overall stacked piezoelectric element, the material for the electrode was selected from aluminum, nickel and copper each alone or alloys based on aluminum, nickel or copper, and further the parts of the electrode which contact with molding resin on the side face of the stacked body and the parts which have to be insulated from the lead-out terminals were subjected to an oxidation or nitriding treatment. As the result, an improved element was obtained which is of a high reliability, suited to low voltage operation and suffers no short-circuit of the electrode even when water permeates to the side face of the stacked body during operation in humid atmosphere.

7 Claims, 6 Drawing Sheets

FIG. 5
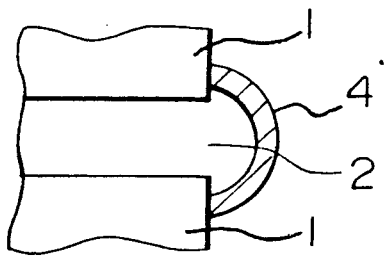
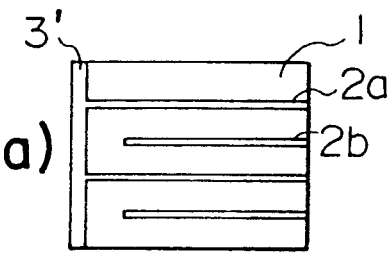
FIG. 6(a)
STACKING, ELECTRODE FORMATION
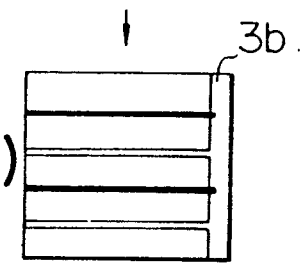
FIG. 6(d)
LEAD TERMINAL FORMATION
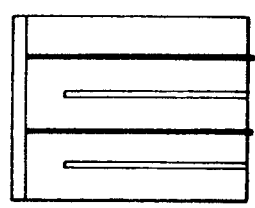
FIG. 6(b)
ANODIC OXIDATION
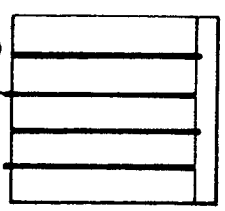
FIG. 6(e)
ANODIC OXIDATION
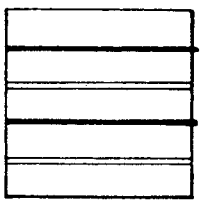
FIG. 6(c)
CUTTING
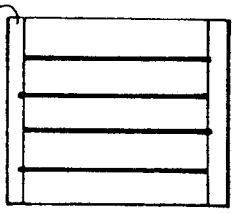
FIG. 6(f)
LEAD TERMINAL FORMATION

METHOD OF MANUFACTURING A STACK-TYPE PIEZOELECTRIC ELEMENT

BACKGROUND OF THE INVENTION

1. Field of the Invention

The present invention relates to a stack-type piezoelectric element, and relates to a structure of an overall stacked piezoelectric actuator which is excellent in moisture durability, reliability and productivity and which particularly can work at low operating voltage.

2. Description of the Prior Art

Piezoelectric ceramics have a property to perform mutual conversion of mechanical energy and electrical energy, so that the application of the ceramics to sensors and actuators for detecting dynamical quantities has been actively developed. However, since the percentage of elongation of piezoelectric ceramics per unit voltage applied is low, very high voltage must be applied to obtain a practically useful displacement. Accordingly, a method is frequently used to lower the voltage to be applied which uses a structure wherein a large number of piezoelectric ceramic sheets of as small a thickness as possible are stacked. Piezoelectric elements having such a structure are called stack-type piezoelectric elements.

One of the most advanced technologies for production of stack-type piezoelectric elements is the green sheet method. In this method, powders of a piezoelectric material are dispersed in a suitable solvent, the resultant slurry is made up into the form of sheet, and a metal paste is coated on the sheet to serve as an electrode by means of screen printing, etc. A large number of the sheets thus obtained are stacked and pressure bonded, then dried and sintered. By virtue of the above method of production, it has become possible to lower the applied voltage necessary to obtain a maximum elongation of 0.1% down to 100 V, which value is commercially accepted as the maximum elongation of piezoelectric elements. Stack-type piezoelectric elements obtained by such prior art green sheet method are already known, for example, from Japanese Patent Publication No. 59-32040 and the article described in Sensor Gijutsu (Technology) 3, No. 12, p. 31 (1983).

Further, as an electrode structure which reduces the internal stress of a stack-type piezoelectric element and improves its reliability, there is described a system wherein the area of the piezoelectric ceramic and that of the electrode are made equal (hereinafter referred to as overall stacked system) in Japanese Patent Publication No. 63-17354. The cross-section of the overall stacked piezoelectric element is shown in FIGS. 8 and 9. FIG. 9 is a sectional view of the element of FIG. 8 taken along line A—A'.

As other examples of prior art related to the present invention, mention may be made of Japanese Patent Application Kokai Nos. (Laid-open) 62-62,571, and No. 61-27,688 etc.

In the former of the prior art methods described above, the sintering of the green sheet of the piezoelectric ceramic sheet 1 and the stacking thereof with the electrode 2 are simultaneously performed at about 1300° C. Therefore, noble metals stable at high temperature, particularly silver-palladium (AgPd) alloy, have been commonly used as the material for the electrode 2. However, piezoelectric elements using said silver-palladium alloy electrode have the problem of a short-circuit between electrodes occurring during operation in humid atmosphere. The cause for this is conceivably that water permeates the molding resin 5 which is to protect the side face of the piezoelectric element, and a layer of water is formed between the stacked body and the resin 5, resulting in a low contact resistance between electrodes, or causing silver to dissolve out as ions (Ag+) thereinto, which are attracted by the electric field and deposited in the vicinity of neighboring electrodes, forming a current-carrying path. This phenomenon is generally called "migration" and is a problem common to all electrical parts using silver or silver-base alloy electrodes.

On the other hand, in overall stacked piezoelectric elements, the latter of the prior art technologies, a method is employed wherein the insulator 4 is coated along the end face of the electrode 2 in order that the electrode 2 and the lead-out terminal 3 are connected alternately, as shown in FIG. 8. In this method, however, the width and the thickness of the insulator 4 must be sufficiently large as compared with the thickness of the electrode 2 so as to ensure necessary dielectric strength, which becomes an obstruction in decreasing the distance between electrodes or the thickness of the piezoelectric ceramic sheet 1, resulting in difficulty in decreasing the operating voltage. Further, since the terminal 3 is formed on the rugged surface of the insulator 4, it causes a problem in its reliability. Another problem is that since the production steps are complicated, the yield of the product is low and the cost of production is high.

SUMMARY OF THE INVENTION

The object of the present invention is to provide a structure of an overall stacked piezoelectric element which undergoes no short-circuit of electrodes even in humid atmosphere, operates particularly at low voltage, exhibits excellent reliability and has low cost.

To achieve the above-mentioned object, plates of single or plural layers of a metallic material selected from the group consisting of aluminum or alloys containing aluminum as the main component, nickel or alloys containing nickel as the main component, copper or alloys containing copper as the main component, are used as metal sheets for electrodes, the metal sheets are electrically contacted alternately with one of a pair of lead terminals, and the parts of the metal sheets bordering the other lead terminal and the molding resin are chemically converted into electrical insulating compounds.

The above means is particularly effective for stack-type piezoelectric elements of so-called overall stacked system, wherein the area of the piezoelectric ceramic sheet is equal to the area of the metal sheet for the electrode.

The piezoelectric element, the process for production thereof, and the products using the same have the characteristics described in the following items.

(1) In a stack-type piezoelectric element comprising a stacked body of plural piezoelectric ceramic sheets and metal sheets lying between the respective piezoelectric ceramic sheets and a pair of lead-out terminals provided to the side face of the stacked body, each of said metal sheet being a plate of a metallic material of single or plural layers selected from the group consisting of aluminum, aluminum-base alloys, nickel, nickel-base alloys, copper and copper-base alloys, said metal sheets are alternately contacted electrically with one of said lead terminals, the other lead terminal is rendered electrically isolated from the metal sheets, and the isolated end parts of the metal sheets are formed of an electrical insulating compound that is a substitution product of said metal sheets.

The term "a electrical insulating compound that is a substitution product of a metal sheet" used herein and hereafter means a product formed by converting at least a portion of the metal sheet into an electrical insulating compound by suitable means, for example, subjecting at least a part of the sheet to an oxidation treatment, thereby converting at least a portion of the part into the oxide of the metal, an insulating compound. By such a treatment, the metal of said portion is, so to speak, replaced by the insulating compound or in other words, the insulating compound is substituted for the metal, not coated onto the metal.

(2) In a stack-type piezoelectric element comprising a stacked body of plural piezoelectric ceramic sheets and metal sheets lying between the respective piezoelectric ceramic sheets and a pair of lead-out terminals provided to the side face of the stacked body, each of said metal sheets being a plate of single or plural layers formed of an active metal capable of being made chemically stable by oxidation and/or nitriding, or an alloy containing said active metal as the main component, said metal sheets are alternately contacted electrically with only one of said lead terminals, the other lead terminal is rendered electrically isolated from the metal sheets, and the isolated end parts of the metal sheets are formed of an electrical insulating compound which is a substitution product of said metal sheets.

(3) In a stack-type piezoelectric element comprising a stacked body of plural piezoelectric ceramic sheets and metal sheets lying between the respective piezoelectric ceramic sheets and a pair of lead-out terminals provided to the side face of the stacked body, the metal sheets are alternately contacted electrically with one of the lead terminals, the other lead terminal is rendered electrically isolated from the metal sheets, and the isolated part of the metal sheets are formed of the oxide and/or the nitride of the materials of said metal sheets.

(4) Said electrical insulating compound is selected from anodically oxidized aluminum, anodically oxidized nickel, plasma discharge-nitrided aluminum and plasma discharge-nitrided nickel.

(5) The side face of said stacked body is coated with a molding resin.

(6) The planar dimension of said piezoelectric ceramic sheet is approximately equal to the planar dimensions of said metal sheet.

(7) The alloy used for said metal sheet is a solid solution of aluminum with any one of silicon, magnesium and germanium, or a mixture thereof.

(8) The alloy used for said metal sheet is a solid solution of nickel with any one of chromium, palladium, and copper or a mixture thereof.

(9) The alloy used for said metal sheet is selected from the group consisting of nickel-phosphorus alloy, copper-phosphorus alloy and copper-zinc alloy.

(10) A heater is provided to the outside of said stacked body.

(11) Said electrical insulating compounds that are substitution products are positioned alternately for every metal sheet.

(12) In a mass flow controller provided in the course of a passage through which a fluid flows with a throttle control mechanism for the passage, said control mechanism comprises a diaphragm facing the passage and a piezoelectric element connected to the diaphragm, said piezoelectric element being constructed according to any of (1)–(11) described above.

(13) In an injection valve wherein a fuel passage which moves with the movement of a cylinder and a fuel passage formed in an outer cylinder having said cylinder built therein are connected or disconnected with the movement of said cylinder, the stack-type piezoelectric element according to any of the above (1)–(11) is used as the means of driving said cylinder.

(14) In a process for production of a stack-type piezoelectric element comprising forming a stacked body by stacking plural piezoelectric ceramic sheets with metal sheets lying between respective ceramic sheets, and then providing a pair of lead-out terminals to a side face of said stacked body, after stacking said metal sheets between the piezoelectric sheets the end part of every other said metal sheet is subjected to an anodic oxidation treatment and the stacked body is cut in two, then one of the lead terminals is formed such that it directly covers the anodically oxidized parts and the untreated metal sheet end parts, subsequently the other end faces of the untreated metal sheet end parts are subjected to anodic oxidation treatment, and then the other lead terminal is formed.

(15) A plasma discharge nitriding treatment is conducted in place of the anodic oxidation treatment of above (14).

(16) A stack-type piezoelectric device (e.g., actuator and sensor) is provided, for example, with an external lead which collects, among the respective electrodes of the above-mentioned piezoelectric elements, the positive electrodes and with an external lead which collects the negative electrodes.

(17) The piezoelectric element is produced by using a metal containing aluminum as the main component for the metal sheet serving as an electrode, electrically contacting every other said metal sheet with only one of a pair of lead terminals, selectively oxidizing by anodic oxidation a part of a metal sheet which is exposed at the side face of the stacked body and the face which contacts the other lead terminal, and subsequently conducting a hole-filling treatment by electrophoresis, to replace the part electrochemically with an electrical insulating compound. In this case, the piezoelectric ceramic sheet and the metal sheet preferably have the same dimension except for the thickness. The metal sheet is preferably formed of aluminum or an alloy of solid solution of aluminum with silicon, magnesium or germanium. Further, an effective metal sheet comprises an aluminum alloy core material and a skin material of an aluminum alloy having a lower melting point than that of the core material formed on the both sides of the core material. In this case, the heat-forming temperature (of the element) is, for example 580–650° C.

(18) The process at least comprises a step of forming a metal film on at least one side surface of a sintered piezoelectric ceramic sheet and a step of stacking the piezoelectric ceramic sheets and heating the sheets while applying pressure thereto to bond the sheets, said metal film being of a structure formed of any one metallic material selected from nickel, nickel-phosphorus alloy, copper, copper-phosphorus alloy, and copper-zinc alloy.

(19) The process at least comprises a step of forming a metal film on at least one side surface of a sintered piezoelectric ceramic sheet and a step of stacking the piezoelectric ceramic sheets with metal layers lying between respective ceramic sheets and heating the sheets while applying pressure thereto to bond the sheets, said metal film being formed of any one metallic material selected from nickel-phosphorus alloy, copper-phosphorus alloy and copper-zinc alloy and the metal layer being optionally formed of any one metallic material selected from nickel and copper.

To sum up, the process for preparation of stack-type piezoelectric elements of the present invention comprises stacking layers of a sintered piezoelectric ceramic material and electrode layers alternately, and then heating, or heating under pressure, the stacked layers at a temperature lower than the sintering temperature of the piezoelectric ceramic material and keeping the layers at the condition for a predetermined time to effect bonding, particularly preferably diffusion bonding, of the stacked layers.

The term "sintered piezoelectric ceramic" referred to herein means the product obtained by sintering a piezoelectric ceramic green sheet.

It is preferable that after the bonding step the bonded body is cooled without removal of applied pressure. Particularly in the course of cooling after the bonding step, it is desirable to apply a voltage at a temperature higher by 20-70° C. than the Curie point of the piezoelectric ceramic to effect the polarization of the ceramic. The "Curie point" referred to herein means the temperature at which the piezoelectric ceramic loses its characteristic property, and the "polarization" means one step of treating the ceramic to convert it into a piezoelectric element.

In general, a piezoelectric ceramic material is a ferroelectric material having a crystal structure of perovskeit type. At a temperature higher than the Curie point it exists as a crystal of cubic system, whereas at a temperature lower than the Curie point it assumes a crystalline phase deformed from the cubic system, resulting in development of dislocation in the crystal structure, that is, polarity (or orientation). The piezoelectric ceramic immediately after sintering is the aggregate of crystal particles, and parts of different polarities are with each other in each crystal particle. In a piezoelectric ceramic which has undergone sintering alone, the sum of polarity vectors for respective crystal particles is zero, and the ceramic is nonpolar as a whole. By application of a predetermined electric field to the ceramic, the direction of polarity is determined for each individual crystal particle. This is called polarization and such a treatment is called polarization treatment.

The material for electrodes may be used in any desired form including film, foil and paste. Particularly preferable as the material are pure aluminum, nickel, aluminum-base alloys and nickel-base alloys, because they do not cause migration unlike silver or silver-base alloy. From the same viewpoint, platinum and palladium may also be used. When an aluminum is used, it preferably has a three layer structure wherein the both skin materials are aluminum-silicon alloy and the core material is aluminum.

The form of stacking is not limited to planar stacking; it may also be a cylindrical one.

Polarization causes the piezoelectric ceramic itself to increase its volume, resulting in development of large internal stress. Accordingly, when the polarization treatment is applied in the course of cooling, the internal strain (in other word, internal stress) is released as the result of compensation between the volume contraction due to cooling and the volume increase due to polarization, and hence the strength reliability of the piezoelectric ceramic is improved.

When pure aluminum or aluminum-base alloys are used as the electrode metal, the stacking temperature (bonding temperature) can be greatly lowered, so that the thermal stress developed is small. Further, since aluminum is an active metal, the bonding of the electrode with the piezoelectric ceramic is improved.

Further, in the present invention, the insert material used for bonding the piezoelectric layers with each other serves also as the electrode material, so that the operations for production are simple.

The main point in the present invention is the use of aluminum, nickel and the like as the electrode material. Aluminum, nickel and the like are very active metals when they have a clean surface, but they change into a chemically stable, so-called passive state when the surface is oxidized or nitrided. Therefore, it is possible to stack sintered piezoelectric ceramic sheets by bonding them with each other utilizing the active surfaces of the above-mentioned metallic materials and to use the metallic material as it is as the electrode. In this case, when the part of the electrode which exposes itself on the side face of the stacked body is subjected to stabilization treatment, lowering of insulation resistance does not occur even when the side face comes to be wet with water during the operation in humid atmosphere, nor does migration due to dissolving out of ions of the electrode into water.

Particularly when the present invention is applied to an overall stacked piezoelectric element in which the electrode is formed over the whole face of the piezoelectric ceramic sheet, an insulator can be formed without producing irregularities on the side face of the element. Accordingly, the thickness of the piezoelectric ceramic sheet can be reduced and hence the operating voltage can be lowered. Further, since the lead terminal is formed on a flat side face, its reliability is improved. Moreover, since the production steps become simple, productivity is also improved.

The above-mentioned stabilization treatment can be achieved, for example, by oxiding that part of the aluminum electrode exposed on the side face of the stacked body which part is not connected with the lead terminal by means of anodic oxidation and further filling remaining holes by electrophoresis, thereby forming a dense electrical insulator. As the result of the treatment, lowering of insulation resistance is prevented from occurring even when the side face comes to be wet with water during the operation in a humid atmosphere.

According to the present invention, the moisture resistance of a stack-type piezoelectric element can be improved, and the operating voltage can be lowered and the reliability can be improved for an overall stacked piezoelectric element.

BRIEF DESCRIPTION OF THE DRAWINGS

FIG. 5 is a sectional view showing one form of the end face of an electrode.

FIG. 6 is a process flow diagram showing the steps for producing the stack-type piezoelectric element of another embodiment of the present invention.

DESCRIPTION OF THE PREFERRED EMBODIMENTS

One embodiment of the present invention will be described below with reference to FIG. 1.

Figure 1:
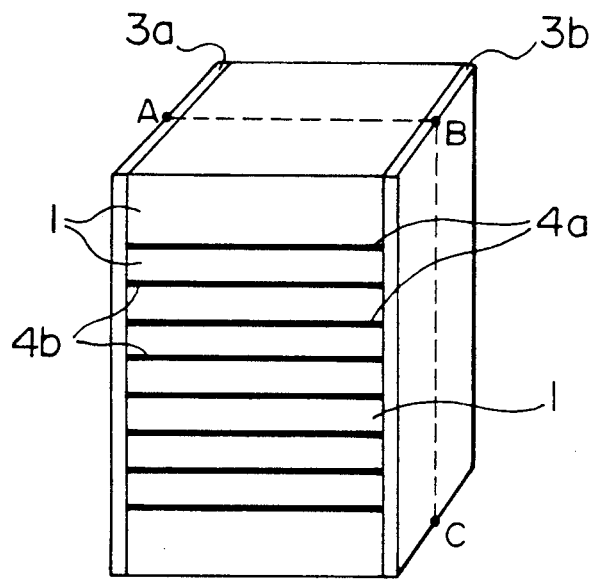
FIG. 1 is a perspective view of the stacked body before being coated with a molding resin, of the stack-type piezoelectric element of one embodiment of the present invention.
Figure 2:
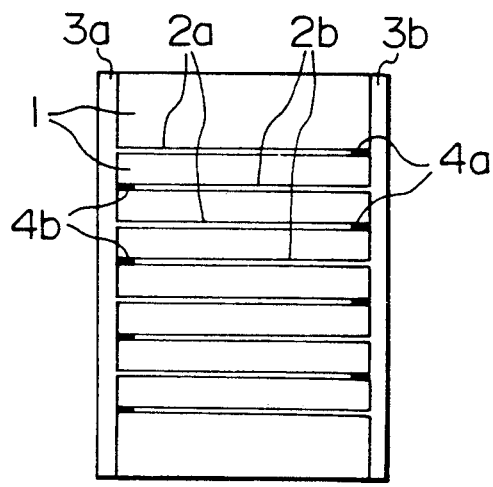
FIG. 2 is a sectional view of the stacked body of FIG. 1 taken along the plane ABC.

FIG. 1 is a perspective view of a stack-type piezoelectric element according to the present invention before being coated on the side face with a molding resin. FIG. 2 is a sectional view of the element shown in FIG. 1 taken along the plane ABC.

Dielectric ceramics which have a property to develop electric polarization when pressure is applied thereto, namely piezoelectricity, are called piezoelectric ceramics, among which barium titanate (Ba TiO$_3$), lead titanate (PbTiO$_3$), lead titanate zirconate (Pb(Zr, Ti)O$_3$) etc. are in wide use.

The powders of these piezoelectric ceramics are mixed with a solvent to obtain a paste, and green sheets are obtained by forming the paste. Piezoelectric ceramic sheets 1 are obtained by sintering the green sheets. A stacked body is obtained by using a plural number of the piezoelectric ceramic sheets 1 thus obtained, as shown in FIGS. 1 and 2, arranging between the respective layers electrode plates 2a and 2b, and then applying heat and pressure.

Lead-out terminals 3a and 3b for electrode plates 2a and 2b are formed at the two places on the side face of the stacked body obtained above, and the electrode plates 2a and 2b of every other layer are connected alternately with the lead terminals 3a and 3b. Subsequently, the end faces of the electrodes 2a and 2b which are not covered with the lead terminals 3a and 3b and expose themselves on the side face of the stacked body are converted into electrically insulating compounds 4a and 4b, for example, oxides or nitrides.

Further, as shown in FIG. 2, the electrode 2a connected to the lead terminal 3a is converted, at the part bordering to the lead terminal 3b, into an electrical insulating compound 4a to prevent electric contact with the terminal 3b, and the electrode 2b connected to the lead terminal 3b is converted, at the part bordering to the lead terminal 3a, into an electrical insulating compound 4b to prevent electric contact with the terminal 3a. The material of respective electrodes 2a and 2b is selected from aluminum, alloys of solid solution of aluminum with silicon, magnesium, or germanium, nickel, and alloys of solid solution of nickel with chromium, palladium, or copper or phosphorus, copper, and alloys of solid solution of copper with phosphorus or zinc.

Figure 3:
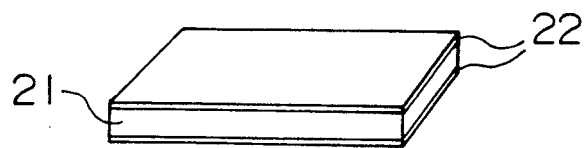
FIG. 3 is a perspective view showing the most effective structure of an electrode for stacking.
Figure 4A:
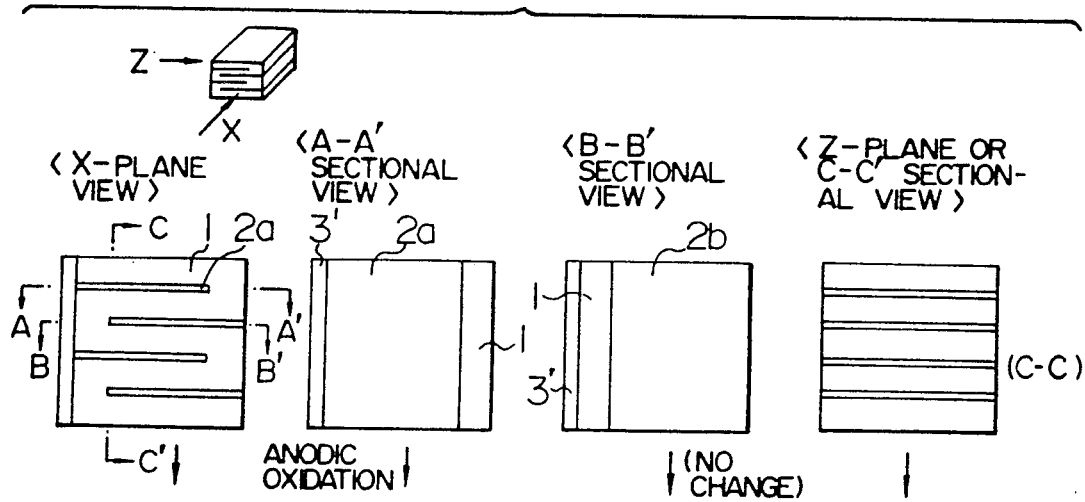
FIG. 4 is a process flow diagram showing the steps for producing the stack-type piezoelectric element of one embodiment of the present invention.
Figure 4B:
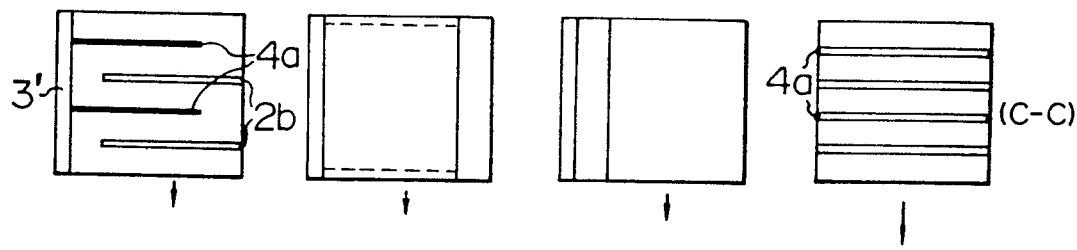
Figure 4C:
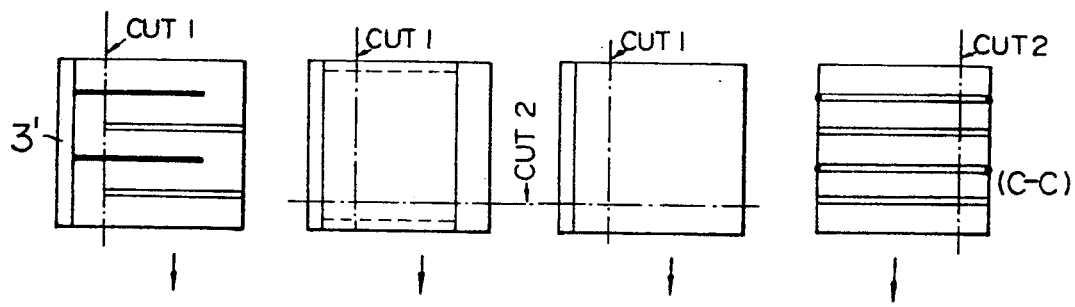
Figure 4D:
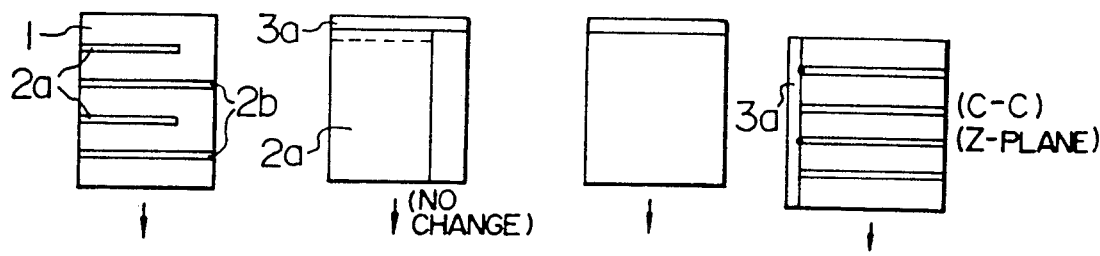
Figure 4E:
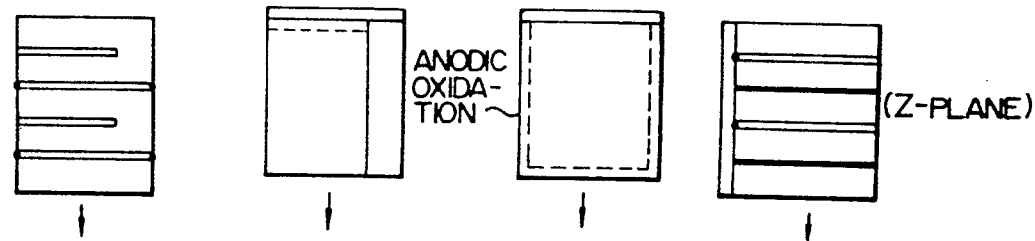
Figure 4F:
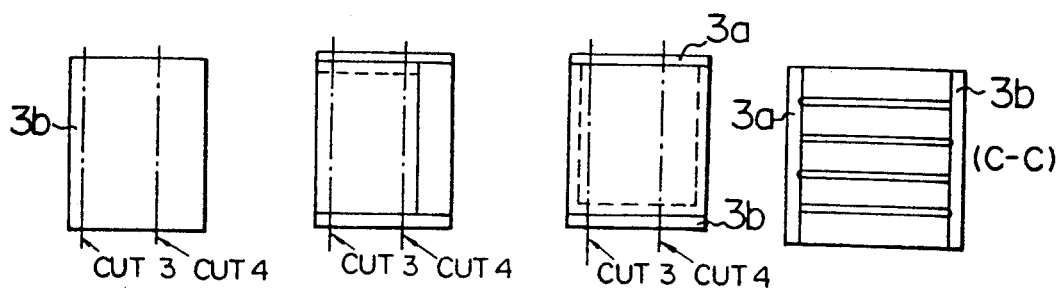

A particularly preferable structure of an electrode is as shown in FIG. 3, wherein a skin material 22 of aluminum alloy, nickel alloy or copper alloy is formed on the both sides of a core material of aluminum, nickel, or copper.

The adoption of the electrode materials and the insulation structures described above offers the following advantages.

First, when an electrode containing aluminum as the main component is used, only the skin layer of the electrode turns to the liquid phase at a heating temperature of 580-660° C. (melting point of aluminum) used in forming a stacked body by heating and application of pressure, so that the oxide film of the aluminum alloy electrode surface is broken and the above-mentioned liquid phase of active alloy promotes the close adhesion and the reaction of the alloy with the piezoelectric ceramic. On the other hand, aluminum of the core material remains as the solid phase, thus forming a dense electrode and keeping a constant thickness of electrode. Also when a nickel electrode or copper electrode is used, the same principle as that for aluminum applies except that the appropriate heating temperature is different.

Figure 8:
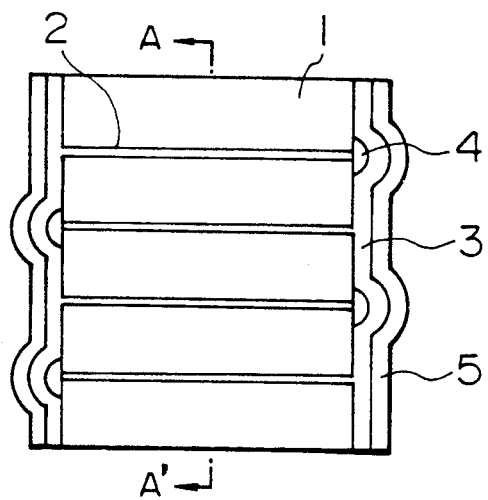
FIG. 8 is a two-directional sectional view of an overall stacked piezoelectric element of the prior art.
Figure 9:
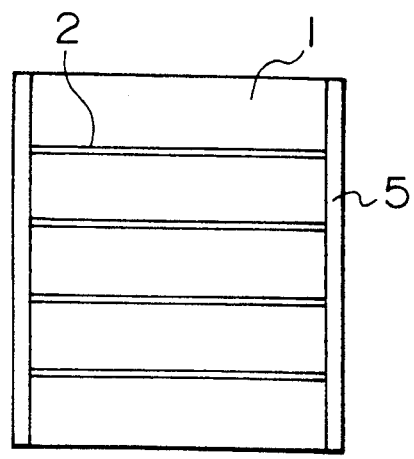
FIG. 9 is the A—A section of the element of FIG. 8.

Secondly, by converting the end face of the electrode used for stacking the piezoelectric ceramic sheets into an insulator, the restriction to the thickness of piezoelectric ceramic sheet 1 imposed in the prior art example (FIG. 8) is removed and the lowering of operating voltage becomes possible. Furthermore since the side face of the stacked body is flat unlike in prior art examples, the form of the lead terminal 3 is smooth and the occurrence rate of breaking of wire is low. Further, the occurrence rate of migration and of the short-circuit between electrode 2 are low even when water permeates molding resin 5 during operation in a humid atmosphere.

A process for production of a stack-type piezoelectric element will be described below with reference to FIG. 4.

a) Formed and sintered piezoelectric ceramic sheets 1 and aluminum alloy electrodes 2a and 2b were stacked alternately, and then heated up to about 600° C. and held at the condition for 1 hour or less while a pressure of 1 kg/mm$^2$ or less was being applied thereto by using a hot press in argon atmosphere, to form a stacked body. The side face of the stacked body was polished and then an electrode 3' was formed on the side face where electrodes 2a of every other layer are exposed.

b) The electrode 3' was subjected to anodic oxidation treatment, whereby the end faces of the electrodes 2a in contact with the electrode 3' were converted to an oxide 4a.

c) The resulting stacked body was divided longitudinally by cutting so as to give an overall stacked structure wherein the electrode 2a and the electrode 2b had the same area. The Figure shows above-mentioned b) viewed from the right side, and shows the oxide 4a as if it is protruding to make its position clear.

d) A lead terminal 3a was formed on the side face where the oxides 4a and the electrodes 2b were alternately present, and was made to contact electrically with the electrodes 2b.

e) The lead terminal 3a was subjected to anodic oxidation treatment, whereby the end faces of the electrodes 2b in contact with the lead terminal 3a were converted into an oxide 4b.

f) A lead terminal 3b was formed on the side face where the electrodes 2a having a metallic surface exposed and the oxides 4b were present alternately, and was made to contact electrically with the electrodes 2b.

Although succeeding steps are not shown in the Figure, a lead wire for application of voltage was bonded to the lead terminal 3, and the side face of the stacked body was coated with molding resin. Finally, polarization treatment was conducted to give an intended piezoelectricity, whereby a stack-type piezoelectric element was obtained.

When nickel alloys are used for the electrode 2, the heating temperature is 850–1300° C., and when copper alloys are used, the heating temperature is 700–1000° C.

Even when the selective oxidation of electrodes by means of anodic oxidation is not conducted and an insulation structure of prior art method is adopted, the effect of preventing the short-circuit of electrodes during operation in humid atmosphere can be attained by nitriding or oxidizing, for example by means of glow discharge plasma, the end faces of the electrodes exposing themselves on the side face of the stacked body before the stacked body is coated with molding resin.

In the embodiment shown above, the end face of electrode was flat. Another embodiment wherein the situation is different will be described below with reference to FIG. 5. When the heating in stacking the piezoelectric ceramic sheets 1 and the electrodes 2 is above the melting temperature of the electrode 2, the electrode 2 will melt and be forced out to the side face of the stacked body as shown in FIG. 5. The electrode 2 of such a form is subjected to anodic oxidation treatment to form an oxide 4. By adopting such a form, the adhesion between the piezoelectric ceramic sheet 1 and the electrode 2 is enhanced and the strength of the stacked body is improved. Moreover, a thick insulator as used in the prior art example is not necessary, so that this method is suited for decreasing the thickness of the piezoelectric ceramic sheet 1.

Another process for production of a stack-type piezoelectric element will be described below with reference to FIG. 6.

a) Formed and sintered piezoelectric ceramic sheets 1 and aluminum alloy electrodes 2a and 2b whose areas are different for every other layer were stacked alternately, and heated up to 600° C. or less and held at the condition for 1 hour or less while a pressure of 1 kg/mm$^2$ or less was being applied thereto by using a hot press in argon atmosphere, to form a stacked body. The side face of the stacked body was polished and then an electrode 3' was formed on the side face where only the electrodes with a larger area expose themselves.

b) The electrode 3' was subjected to anodic oxidation treatment, whereby the end faces of the electrodes 2a in contact with the electrode 3' were converted to an oxide 4a. Though the Figure shows the oxide 4 as if it is protruding on the face opposite to the electrode 3' in order to emphasize that said opposite face is also converted to oxide, actually the face is flat.

c) The stacked body was subjected to a cutting work such that the electrodes 2a and 2b become of the same area and an overall stacked structure is obtained.

d) A lead terminal 3b was formed on the electrodes 2a of which every other layer has been subjected to oxidation treatment, and was made to contact electrically with the electrode 2b.

e) The lead terminal 3b was subjected to anodic oxidation treatment, whereby the end faces of the electrodes 2b were converted to an oxide 4b.

f) A lead terminal 3a was formed on the side face where the electrodes 2a having a metallic surface exposed and the oxides 4b were present alternately, and was made to contact electrically with the electrodes 2a.

Succeeding steps are the same as those in the embodiment described before.

The process described above is suited to production of stack-type piezoelectric elements which use electrodes of relatively large area and require no cutting of the stacked body.

In each of the embodiments described above, such measures may also be adopted as improving the water permeability of molding resin which coats the outermost layer of the piezoelectric element to prevent water from coming into the element, or covering the element completely with a metallic cover. Examples of suitable molding resins include epoxy resins (which are used for molding most of the semiconductor elements), or epoxy resins incorporated with phenol-novolak resin as a cure accelerator, silicone rubber as a flexibility-imparting agent or powders of silica or alumina as a filler for improving the strength; and further polyimide resins, fluorocarbon resins, etc.

As examples of active metals which can be chemically stabilized by oxidation or nitriding, mention may be made, besides aluminum, aluminum-base alloys, nickel, and nickel-base alloys, of tin, tin-base alloys, indium, indium-base alloys, titanium, titanium-base alloys, zirconium, zirconium-base alloys, iron, iron-base alloys, zinc, zinc-base alloys, etc.

Figure 7:
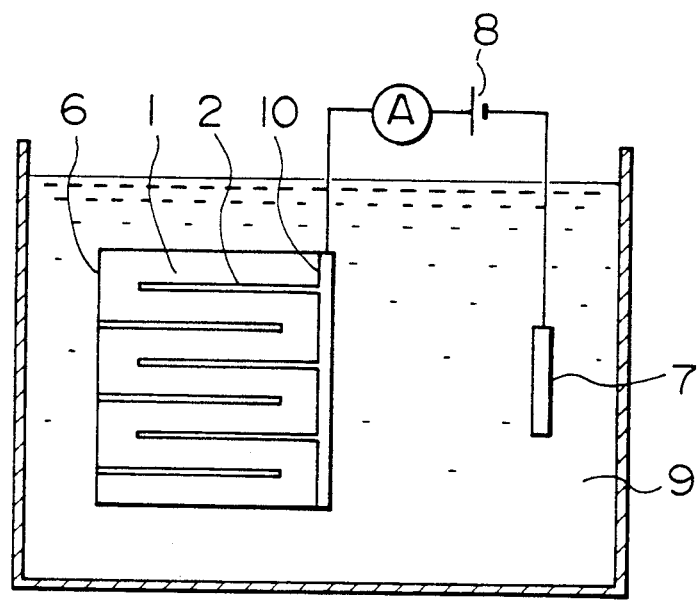
FIG. 7 is a diagram for illustrating an apparatus used for forming an insulator layer.

Then, an embodiment regarding the method for insulation treatment of electrode end faces will be described further with reference to FIG. 7. Piezoelectric ceramic sheets 1 and aluminum alloy electrodes 2 having a smaller area than the former are stacked to obtain an alternately stacked body 6 as shown in the Figure. A temporary electrode 10 is formed at the positions in the side face of the body obtained above where the end faces of electrodes of every other layer expose themselves. Then the stacked body is immersed in an electrolytic solution 9 while a direct current 8 is being connected such that the temporary electrode acts as the anode and a metal 7 having a stronger ionization tendency than has the temporary electrode 10 acts as the cathode. With this apparatus, the surface of the electrode 2 in contact with the temporary electrode 10 is anodically oxidized and a porous oxide layer is formed. The electrolytic solution used here is, for example, a dilute aqueous solution of sulfuric acid, oxalic acid, boric acid, etc. Then the stacked body is subjected to electrophoresis wherein the body is immersed in a dilute electrolytic solution containing a resin dispersed therein in place of the electrolytic solution, whereby the resin is impregnated or attached to the inside and the surface of the holes of the porous oxide layer present on the surface of the anodically oxidized electrode 2; thus the hole-filling treatment is attained and a dense electrical insulating compound layer is formed on the end face of the electrode 2. The insulating layer thus formed insulates the lead-out terminal and the internal electrode from each other.

The above embodiments were described mainly with aluminum electrodes as examples. When a nickel electrode is used, a combination of a core material 21 of nickel and a skin material of nickel-phosphorus alloy is preferable, and when a copper electrode is used a combination of a core material 21 of copper and a skin material 22 of copper-phosphorus alloy or copper-zinc alloy is preferable.

When an electrode plate comprising nickel as the main component is used and the heating temperature for forming the stacked body by heat and pressure is 900-1050° C., only the skin layer of the electrode plate turns to the liquid phase, so that the oxide film on the nickel-phosphorus alloy electrode plate surface is broken, and the liquid phase of active nickel-phosphorus alloy promotes the close adhesion and reaction with the piezoelectric ceramic. On the other hand, nickel of the core material remains solid and thus a predetermined thickness of the electrode plate is maintained.

When an electrode plate comprising copper as the main component is used, the same effect as that obtained in using nickel as the main component can be obtained at heating temperature of 700-1000° C.

As to the method for forming an electrode metal on the piezoelectric ceramic, besides those described above, the following methods are effective: coating of a paste of metallic material followed by baking, plating, physico-chemical vapor deposition methods such as evaporation and sputtering, etc.

Stacked bodies were formed by stacking piezoelectric ceramic sheets coated with metal films as described above and heating them while applying pressure thereto. The applied pressure was, for example, 0.5 kgf/mm² and the bonding atmosphere was air or an inert gas (e.g. Ar). A high bonding strength was obtained by setting the heating temperature at 850-1050° C. for nickel-phosphorus alloys, about 1060° C. for copper, 700-950° C. for copper-phosphorus alloys, and 800-950° C. for copper-zinc alloys.

When an electrode plate of plural layers is used, the stacked body may be formed, for example, by alternately stacking a piezoelectric ceramic sheet 1 coated with a metal film 22 comprising as the main component a nickel-phosphorus alloy, copper-phosphorus alloy or copper-zinc alloy and a nickel or copper plate 21, and heating them under applied pressure. Through the use of this method, only the metal layer of alloy turns to the liquid phase and the metal film 2 remains solid, keeping a predetermined electrode plate thickness, so that the respective layers of the stacked body are formed parallel to one another, no bending stress develops in the piezoelectric ceramic sheets, and resultantly a stacked body with little of strain can be obtained.

Figure 10:
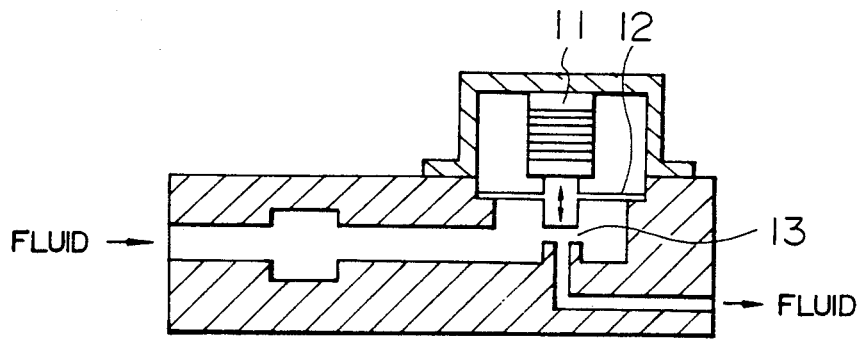
FIG. 10 is a longitudinal section of a mass flow controller relating to an application example.

FIG. 10 is a longitudinal section showing one example of a mass flow controller using the stack-type piezoelectric element of the present invention. In FIG. 10, a piezoelectric element 11 is elongated or contracted by applying a voltage thereto, the motion is transmitted to a diaphragm 12, whereby the opening of an orifice 13 provided in the passage of a fluid (e.g., gas) to be controlled is adjusted and the flow rate is controlled.

Such a mass flow controller shows a response behavior drastically improved as compared with the prior art controller using a solenoid. Further, a short life and a high operating voltage, which are serious problems in using piezoelectric element of prior art structures, can be improved.

Figure 11:
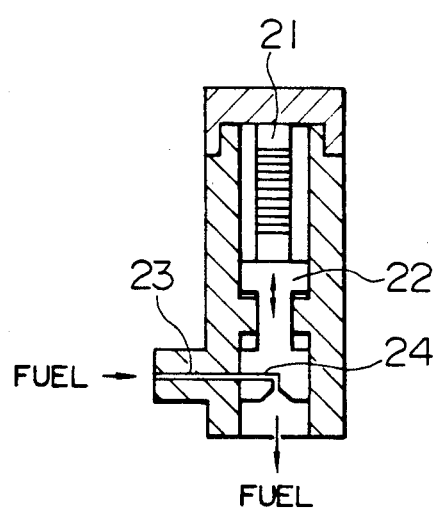
FIG. 11 is a longitudinal section of an injection valve relating to an application example.

FIG. 11 is a longitudinal section showing one example of the structure of an injection valve using the stack-type piezoelectric element of the present invention. In FIG. 11, a piezoelectric element 21 is elongated or contracted by applying a voltage thereto, the motion is transmitted to a cylinder 22, whereby a passage 23 of fuel inlet side is connected with a passage 24 provided to the cylinder. The amount of injected fuel is controlled by adjusting the length of time of voltage application to the piezoelectric element.

Such an injection valve does not require a step-up transformer for high voltage impression unlike in the use of piezoelectric elements of prior art structures and is free from such problems as shortening of life due to adhesion of fuel mists. Thus, the most efficient use can be made of the advantage of the use of piezoelectric elements, namely improvement in the response and accuracy of fuel injection.

Figure 12:
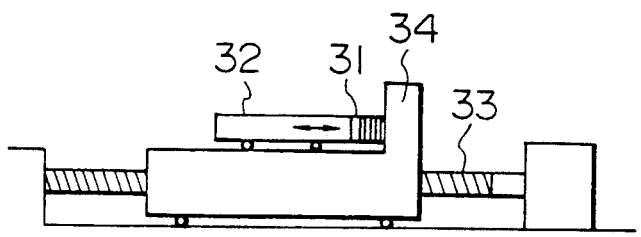
FIG. 12 is a longitudinal section of a movable stage for precision positioning relating to an application example.

FIG. 12 is a side view showing one example of a movable stage for precision positioning using the stack-type piezoelectric element of the present invention. In FIG. 12, a stage 34 is a coarse adjustment stage which is moved by a linear actuator 33 such as a ball screw. A fine adjustment stage 32 provided on the former stage is moved by means of a piezoelectric element 31.

The use of the piezoelectric element of the present invention in such a movable stage makes it possible to improve the moisture resistance and the reliability of movable stages using piezoelectric elements having a more excellent response behavior and accuracy than those of the prior art and to construct a movable stage capable of operating with excellent reliability even in humid atmosphere.

Figure 13:
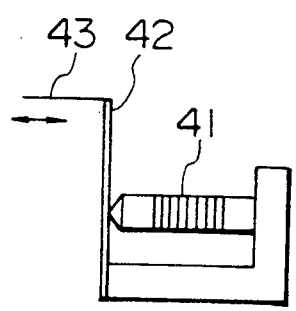
FIG. 13 is a longitudinal section of the printing head of a printer relating to an application example.

FIG. 13 is a side view showing one example of the structure of the printing head of a printer using the stack-type piezoelectric element of the present invention. In FIG. 13, a displacement produced by a piezoelectric element 41 is transmitted via a lever of a plate spring 42 to a printing pin 43 to perform printing.

Such a printing head has not only an excellent response behavior but also an advantage of exhibiting a strong printing power with a very small size. Further, it exhibits a high performance of keeping a sufficient reliability even in a humid atmosphere.

What is claimed is:

1. A process for production of a stack-type piezoelectric element comprising forming a stacked body by stacking plural piezoelectric ceramic sheets and metal sheets lying between respective piezoelectric ceramic sheets and then providing a pair of lead-out terminals to the side face of said stacked body, which comprises, after stacking said metal sheets between said piezoelectric ceramic sheets, subjecting the end parts of every other said metal sheet to an anodic oxidation followed by dividing the stacked body by cutting, forming one of the lead terminals such that it directly covers the anodic oxidation-treated parts and the untreated metal sheet end parts, then subjecting the other end faces of the untreated metal sheet end parts to an anodic oxidation treatment and subsequently forming the other lead terminal.

2. A process for production of a stack-type piezoelectric element comprising forming a stacked body by stacking plural piezoelectric ceramic sheets and metal sheets lying between respective piezoelectric ceramic sheets and then providing a pair of lead-out terminals to the side face of said stacked body, which comprises, after stacking said metal sheets between respective piezoelectric ceramic sheets, subjecting the end parts of every other said metal sheet to an anodic oxidation followed by dividing the stacked body by cutting, forming one of the lead terminals such that it directly covers the anodically oxidized parts and the untreated metal sheet end parts, then subjecting the other end faces of the untreated metal sheet end parts to plasma discharge nitriding treatment and subsequently forming the other lead terminal.

3. A process for production of a stack-type piezoelectric element comprising a stacked body formed by stacking piezoelectric ceramic sheets and metal sheets alternately and a pair of lead-out terminals formed on the side face of said stacked body and connected alternately to said metal sheets, wherein said metal sheets comprise aluminum as the main component, and the contact parts of the metal sheets with the lead terminal other than the one connected with the metal sheets and the parts exposing themselves on the side face of the stacked body are selectively oxidized by anodic oxidation and subjected to a hole-filling treatment by means of electrophoresis, whereby the metal of said parts is electrochemically replaced with an electrically insulating compound.

4. A process for production of a stack-type piezoelectric element comprising a stacked body formed by stacking piezoelectric ceramic sheets and metal sheets alternately and a pair of lead-out terminals formed on the side face of said stacked body and connected alternately to said metal sheets, wherein said piezoelectric ceramic sheets and said metal sheets are of the same dimension except for thickness, said metal sheets comprise aluminum as the main component, and the contact parts of the metal sheets with the lead terminal other than the one connected with the metal sheets and the parts exposing themselves on the side face of the stacked body are selectively oxidized by anodic oxidation and subjected to a hole-filling treatment by means of electrophoresis, whereby the metal of said parts is electrochemically replaced with an electrically insulating compound.

5. A process for production of a stack-type piezoelectric element comprising a stacked body formed by stacking piezoelectric ceramic sheets and metal sheets alternately and a pair of lead-out terminals formed on the side face of said stacked body and connected alternately to said metal sheets, wherein aluminum or an alloy of solid solution of aluminum with silicon, magnesium or germanium is used for said metal sheet, and the contact parts of said metal sheets with the lead terminal other than the one connected with the metal sheets and the parts exposing themselves on the side face of the stacked body are selectively oxidized by anodic oxidation and subjected to a hole-filling treatment by means of electrophoresis, whereby the metal of said parts is electrochemically replaced with an electrical insulating compound.

6. A process for production of a stack-type piezoelectric element comprising a stacked body formed by stacking piezoelectric ceramic sheets and metal sheets alternately and a pair of lead-out terminals formed on the side face of the stacked body and connected alternately to said metal sheets, wherein said metal sheet comprises a core material of an aluminum alloy and a skin material of an aluminum alloy having a melting point lower than that of the core material on both sides of the core material, the contact parts of said metal sheets with the lead terminal other than the one connected with the metal sheets and the parts exposing themselves on the side face of the stacked body are selectively oxidized by anodic oxidation and subjected to a hole-filling treatment, whereby the metal of said parts is electrochemically replaced with an electrically insulating compound.

7. A process for production of a stack-type piezoelectric element comprising a stacked body formed by stacking piezoelectric ceramic sheets and metal sheets alternately and a pair of lead-out terminals formed on the side face of the stacked body and connected alternately to said metal sheets, wherein said metal sheet is formed by interposing a core material of an aluminum alloy between two skins of an aluminum alloy having a melting point lower than that of the core material and heat-forming them at 580–650° C., and the contact parts of said metal sheets with the lead terminal other than the one connected with the metal sheets and the parts exposing themselves on the side face of the stacked body are selectively oxidized by anodic oxidation and subjected to a hole-filling treatment by means of electrophoresis, whereby the metal of said parts is electrochemically replaced with an electrical insulating compound.

* * * * *